US011577334B2

(12) United States Patent
Teraoka et al.

(10) Patent No.: US 11,577,334 B2
(45) Date of Patent: Feb. 14, 2023

(54) SOLDERING APPARATUS, COMPUTER-READABLE MEDIUM, AND SOLDERING METHOD

(71) Applicant: Hakko Corporation, Osaka (JP)

(72) Inventors: Yoshitomo Teraoka, Osaka (JP); Satoshi Manda, Osaka (JP); Tomoo Takahara, Osaka (JP)

(73) Assignee: HAKKO CORPORATION, Osaka (JP)

( * ) Notice: Subject to any disclaimer, the term of this patent is extended or adjusted under 35 U.S.C. 154(b) by 1112 days.

(21) Appl. No.: 16/205,942

(22) Filed: Nov. 30, 2018

(65) Prior Publication Data

US 2019/0160574 A1    May 30, 2019

(30) Foreign Application Priority Data

Nov. 30, 2017    (JP) .............................. JP2017-230236

(51) Int. Cl.
| | |
|---|---|
| *H05K 3/34* | (2006.01) |
| *B23K 3/08* | (2006.01) |
| *B23K 3/06* | (2006.01) |
| *B23K 3/02* | (2006.01) |
| *G05B 19/18* | (2006.01) |
| *G06F 30/39* | (2020.01) |
| *B23K 31/02* | (2006.01) |

(52) U.S. Cl.
CPC ................ *B23K 3/087* (2013.01); *B23K 3/02* (2013.01); *B23K 3/0607* (2013.01); *B23K 3/08* (2013.01); *B23K 31/02* (2013.01); *G05B 19/18* (2013.01); *G06F 30/39* (2020.01); *H05K 3/34* (2013.01)

(58) Field of Classification Search
CPC ........ B23K 3/087; B23K 3/02; B23K 3/0607; B23K 3/08; B23K 31/02; G05B 19/18; G06F 30/39; H05K 3/34
See application file for complete search history.

(56) References Cited

U.S. PATENT DOCUMENTS

| | | | | | |
|---|---|---|---|---|---|
| 5,261,590 | A | * | 11/1993 | Tsai | .................... F16M 11/14 |
| | | | | | 228/55 |
| 5,525,777 | A | * | 6/1996 | Kukuljan | ............ B23K 1/0056 |
| | | | | | 219/121.65 |
| 5,542,600 | A | * | 8/1996 | Kobayashi | ....... G05B 19/41885 |
| | | | | | 228/103 |

FOREIGN PATENT DOCUMENTS

| | | |
|---|---|---|
| JP | 10-150295 A | 6/1998 |
| JP | 2009-83084 A | 4/2009 |

(Continued)

*Primary Examiner* — Donghai D Nguyen
(74) *Attorney, Agent, or Firm* — Squire Patton Boggs (US) LLP

(57) ABSTRACT

Gerber data for a substrate includes coordinates for physical features on the substrate. The coordinates are relative to a substrate origin point on the substrate. The gerber data allows a user to specify any of the physical features as soldering targets of a soldering apparatus that includes a motor for moving a soldering iron according to coordinates relative to a system origin point of the soldering apparatus. When the substrate is placed on the soldering apparatus, its substrate origin point differs from the system origin point of the soldering apparatus. The user may input coordinates for the substrate origin point, which are used by the soldering apparatus to derive coordinates, usable by soldering apparatus, from coordinates in the gerber data. In this way, it is possible to reduce the workload of the user when programming the soldering apparatus to perform a soldering process.

16 Claims, 8 Drawing Sheets

(56) References Cited

FOREIGN PATENT DOCUMENTS

JP    2010-231518 A    10/2010
WO    2009/031305 A1   3/2009

\* cited by examiner

FIG.4

```
...
DISTANCE UNIT: INCH
TYPE: DRILL HOLE
...
PORTION D10: DIAMETER d10, PLATED HOLE, CIRCULAR...
PORTION D11: DIAMETER d11, PLATED HOLE, CIRCULAR...
PORTION D12: SIDE d121, d122, PLATED HOLE, RECTANGULAR...
...
D10
(xb101,yb101)
(xb102,yb102)
(xb103,yb103)
...
D11
(xb111,yb111)
(xb112,yb112)
...
D12
(xb121,yb121)
(xb122,yb122)
...
```

SOLDERING APPARATUS, COMPUTER-READABLE MEDIUM, AND SOLDERING METHOD

CROSS-REFERENCE TO RELATED APPLICATION

This application claims the benefit of Japanese Application No. 2017-230236, filed Nov. 30, 2017, which is incorporated herein by reference.

TECHNICAL FIELD

The present invention relates to a soldering apparatus for automatically soldering at predetermined soldering target positions, a computer readable storage medium that stores a program to make the computer control the soldering apparatus, and a soldering method executed by the computer that controls the soldering apparatus.

BACKGROUND ART

Various soldering apparatuses for automatically soldering at predetermined soldering target positions have been developed. For example, according to Japanese Patent Laid-Open No. 2000-75912, an operator can input coordinate values of soldering target positions to a personal computer and set the soldering target positions (a so-called teaching operation). The soldering apparatus can perform soldering at the positions represented by the input coordinate values.

Under the technique of setting the soldering target positions described above, an operator needs to input all coordinate values of many soldering target positions on a substrate. Therefore, the technique of setting the soldering target positions described above requires a great deal of labor of the operator who inputs the coordinate values of the soldering target positions.

SUMMARY OF INVENTION

It is an object of the present invention to provide a soldering apparatus capable of reducing labor of an operator who inputs coordinate values of soldering target positions. Briefly and in general terms, the present invention is directed to a soldering apparatus, a non-transitory computer-readable medium, and a soldering method.

In aspects of the invention, a soldering apparatus comprises a motor and a computer. The motor is configure to move a soldering iron relative to a system origin point. The computer is configured to receive gerber data including definitions of a plurality of physical features of a substrate, the definitions including substrate coordinates for each of the physical features relative to a substrate origin point on the substrate, the substrate origin point being different from the system origin point. The computer is configured to receive, separately from the gerber data, system coordinates for the substrate origin point, the system coordinates for the substrate origin point being relative to the system origin point. The computer is configured to extract from the received gerber data, the substrate coordinates of at least one of the physical features. The computer is configured to use the extracted substrate coordinates to derive system coordinates for the at least one of the physical features of the substrate, the system coordinates for the at least one of the physical features being relative to the system origin point. The computer is configured to control the motor according to at least some of the derived system coordinates in order to perform a soldering process on the substrate.

In aspects of the invention, a non-transitory computer-readable medium stores instructions which, when executed by a computer of a soldering apparatus having a motor configured to move a soldering iron relative to a system origin point, cause the computer to perform a soldering method. The method comprises receiving gerber data including definitions of a plurality of physical features of a substrate, the definitions including substrate coordinates for each of the physical features relative to a substrate origin point on the substrate, the substrate origin point being different from the system origin point; receiving, separately from the gerber data, system coordinates for the substrate origin point, the system coordinates for the substrate origin point being relative to the system origin point; extracting from the received gerber data, the substrate coordinates of at least one of the physical features of the substrate; using the extracted substrate coordinates to derive system coordinates for the at least one of the physical features of the substrate, the system coordinates for the at least one of the physical features being relative to the system origin point; and controlling the motor according to at least some of the derived system coordinates in order to perform a soldering process on the substrate.

In aspects of the invention, a soldering method is performed by a computer of a soldering apparatus having a motor configured to move a soldering iron relative to a system origin point. The method comprises receiving gerber data including definitions of a plurality of physical features of a substrate, the definitions including substrate coordinates for each of the physical features relative to a substrate origin point on the substrate, the substrate origin point being different from the system origin point; receiving, separately from the gerber data, system coordinates for the substrate origin point, the system coordinates for the substrate origin point being relative to the system origin point; extracting from the received gerber data, the substrate coordinates of at least one of the physical features of the substrate; and using the extracted substrate coordinates to derive system coordinates for the at least one of the physical features of the substrate, the system coordinates for the at least one of the physical features being relative to the system origin point; and controlling the motor according to at least some of the derived system coordinates in order to perform a soldering process on the substrate.

According to the soldering apparatus, the non-transitory computer-readable medium, and the soldering method described above, it is possible to reduce labor of an operator who inputs coordinate values of soldering target positions.

The objects, features, and advantages of the invention will become more apparent from the following detailed description and the accompanying drawings.

BRIEF DESCRIPTION OF DRAWINGS

FIG. 4 is a diagram showing an example of contents of gerber data;

DESCRIPTION OF EMBODIMENTS

Data for fabricating printed circuit boards (PCBs) are provided to a manufacturer in a format that is usable by various types of fabrication and inspection equipment. Such data may be generated by a computer-aided design (CAD) system, which was used to design the PCB. As used herein, the term "gerber data" refers to such data, which has potential use in the fabrication of a PCB or other type of substrate. Gerber data comprises alphanumeric characters that comply with the ASCII character-encoding standard. The alphanumeric characters may be arranged in a format that satisfies an industry standard, such as Extended Gerber or Standard Gerber. However, since standards may continue to evolve, it is to be understood that gerber data, as used herein, may be in a format other than Extended Gerber and Standard Gerber. It is also to be understood that the alphanumeric characters contained in gerber data may comply with ASCII, Unicode, or other character-encoding standard.

After a substrate is fabricated, possibly through the use of gerber data, components are attached to the substrate, such as by soldering. As will become apparent from the descriptions below, a soldering apparatus may be programmed by a user by entering numerical values for coordinates of prospective soldering targets on a substrate. As used herein, a "substrate" is a piece of material on which a soldering process will be performed. A printed circuit board (PCB) is a non-limiting example of a substrate. In addition to entering numerical values, programming of the soldering apparatus may be performed by the user manipulating various control levers to move a soldering iron tip to prospective soldering targets on a substrate. The coordinates of the current position of the soldering iron tip are displayed on a user input interface. The user may edit the coordinates on the user interface. When desired by the user, the coordinates are stored in the soldering apparatus for later use. This allows a soldering apparatus to perform a soldering process autonomously, at a later time, on the same substrate used during the programming process or another substrate similar to the substrate used during the programming process. The programming process can be time consuming and prone to human error. To reduce workload and enhance programming accuracy, some information may be extracted from gerber data. The extracted information, namely substrate coordinates, are used to derive coordinates (referred to as system coordinates) that are usable by the soldering apparatus.

As used herein, the term "user" and "operator" are used interchangeably and refer to a person.

<Schematic Structure of Soldering Apparatus>

Figure 1:
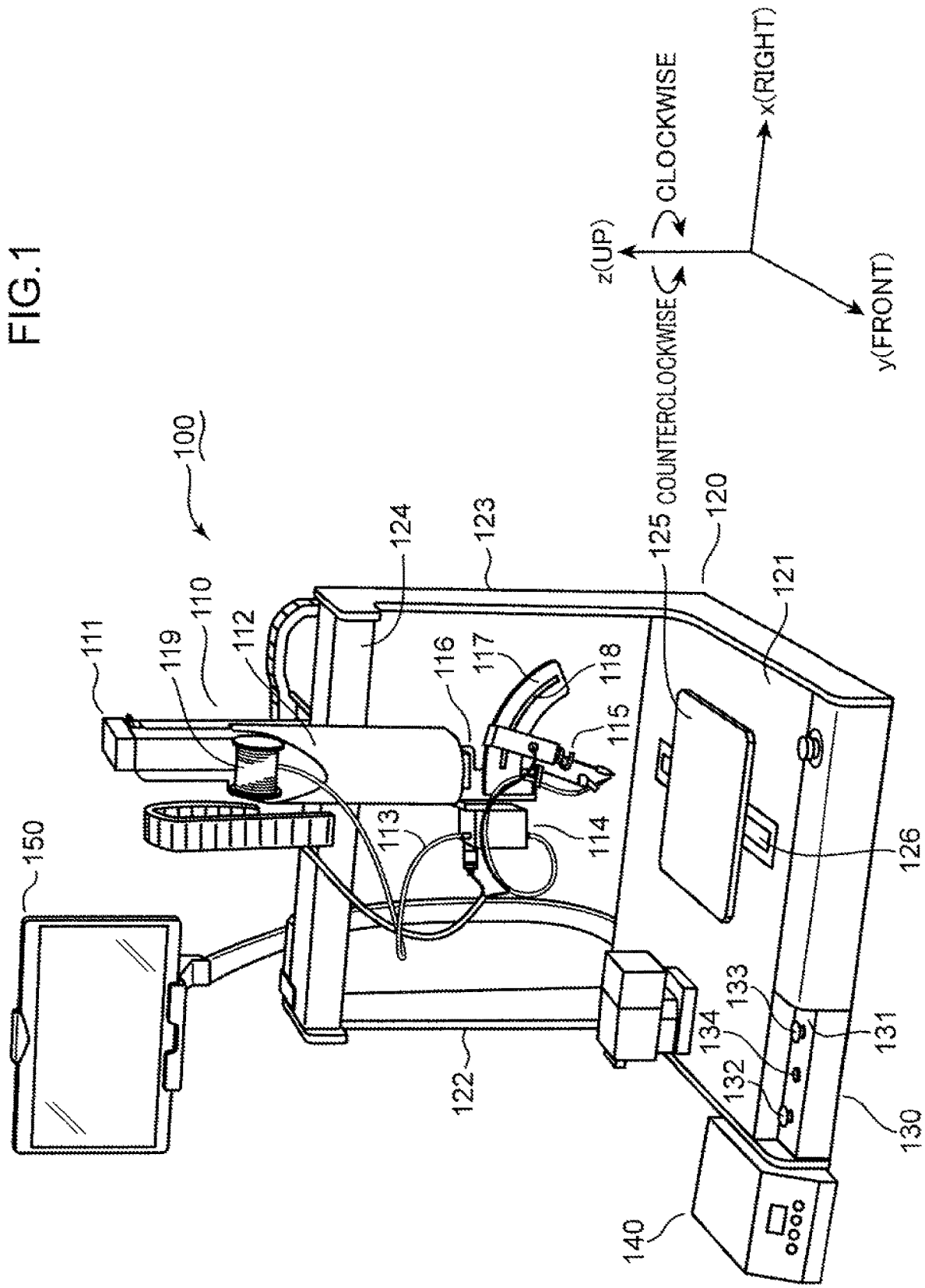
FIG. 1 is a schematic perspective view of a soldering apparatus.

FIG. 1 is a schematic perspective view of a soldering apparatus 100 developed by the present inventors. With reference to FIG. 1, a schematic structure of the soldering apparatus 100 will be described.

FIG. 1 shows orthogonal coordinates defined by x, y and z axes. In the following description, a positive direction of the x axis is defined as "right". A negative direction of the x axis is defined as "left". A positive direction of the y axis is defined as "front". A negative direction of the y axis is defined as "rear". A positive direction of the z axis is defined as "up". A negative direction of the z axis is defined as "down". Terms "clockwise" and "counterclockwise" refer to rotation about a rotation axis parallel to the z axis. These terms representing the directions are used for clarity of explanation only. Therefore, a principle of the present embodiment is not limited to these terms representing the directions.

The soldering apparatus 100 includes a soldering mechanism 110, a support 120, an operation unit 130, a heating control unit 140, an input interface 150, and a driving unit (not shown).

The soldering mechanism 110 performs soldering to a substrate (not shown). The support 120 supports the soldering mechanism 110, the operation unit 130, and the driving unit. A plurality of motors used as the driving unit is attached to the support 120 and the soldering mechanism 110. The operation unit 130 can be suitably used for inputting coordinate values of soldering target positions on the substrate. When an operator operates the operation unit 130, the driving unit moves or rotates the soldering mechanism 110 in a direction determined by the operation on the operation unit 130. The heating control unit 140 is used for temperature control of the soldering mechanism 110. The input interface 150 is used for inputting various data and instructions to the soldering apparatus 100 and for displaying various data.

The support 120 includes a base 121, two columns 122, 123, a support bridge 124, and an installation base 125. The base 121 is a substantially rectangular plate-like portion. The column 122 is erected upward from a left edge of the base 121. The column 123 is erected upward from a right edge of the base 121. The columns 122, 123 are aligned in the x-axis direction. The support bridge 124 is bridged from the left column 122 to the right column 123. Therefore, the support bridge 124 extends in the x-axis direction. The soldering mechanism 110 is attached to the support bridge 124. When the operator operates the operation unit 130, one of the plurality of motors used as the driving unit can move the soldering mechanism 110 along the support bridge 124.

The installation base 125 is a substantially rectangular thin plate-like portion installed on an upper surface of the base 121. The operator can fix the substrate on the installation base 125 with a jig (not shown). The operator can operate the operation unit 130 to move the soldering mechanism 110 above the installation base 125 in the x-axis direction and the z-axis direction, or to rotate the soldering mechanism 110 around the rotation axis parallel to the z axis. As shown in FIG. 1, a slot 126 extending in a y-axis direction is formed on the upper surface of the base 121. When the operator operates the operation unit 130, one of the plurality of motors used as the driving unit can move the installation base 125 along the slot 126. A relative position between the substrate on the installation base 125 and the soldering mechanism 110 is adjusted by the movement of the soldering mechanism 110 in the x-axis direction and the z-axis direction. The relative position between the substrate on the installation base 125 and the soldering mechanism 110 is adjusted by the movement of the installation base 125 in the y-axis direction.

The soldering mechanism 110 includes a horizontally movable column 111, a vertically movable column 112, a thread solder 113, a solder feeding unit 114, a soldering iron 115, and a holding unit 116. The horizontally movable column 111 holds the vertically movable column 112, the thread solder 113, the solder feeding unit 114, the soldering iron 115, and the holding unit 116, and moves in the x-axis direction under the operation of the driving unit. The vertically movable column 112 holds the thread solder 113, the solder feeding unit 114, the soldering iron 115, and the holding unit 116, and moves in the z-axis direction under the operation of the driving unit. The holding unit 116 holds the solder feeding unit 114 and the soldering iron 115, and move these around the rotation axis substantially coinciding with the vertical central axis of the vertically movable column 112. Under the control of a control section 170 which will be described later, the solder feeding unit 114 feeds the thread solder 113 to the iron tip forming the end of the soldering iron 115. Under the temperature control of the heating control unit 140, the soldering iron 115 melts the thread solder 113 fed from the solder feeding unit 114.

The horizontally movable column 111 is a columnar member elongated in the z-axis direction. The horizontally movable column 111, the support bridge 124, and the driving unit are designed so that the horizontally movable column 111 moves substantially horizontally along the support bridge 124 when one of the plurality of motors forming the driving unit is operated. Any structure known in the art may be applied to the design of the horizontally movable column 111, the support bridge 124, and the driving unit. Therefore, the principle of the present embodiment is not limited to a specific coupling structure among the horizontally movable column 111, the support bridge 124, and the driving unit.

Like the horizontally movable column 111, the vertically movable column 112 is a columnar member elongated in the z-axis direction. The vertically movable column 112, the horizontally movable column 111, and the driving unit are designed so that the vertically movable column 112 moves substantially vertically along the horizontally movable column 111 when one of the plurality of motors forming the driving unit is operated. Any structure known in the art may be applied to the design of the vertically movable column 112, the horizontally movable column 111, and the driving unit. Therefore, the principle of the present embodiment is not limited to a specific coupling structure among the vertically movable column 112, the horizontally movable column 111, and the driving unit.

The holding unit 116 is used for holding the solder feeding unit 114 and the soldering iron 115. The holding unit 116 is connected to a lower end of the vertically movable column 112. Therefore, the holding unit 116, the solder feeding unit 114, and the soldering iron 115 can move upward, downward, leftward, and rightward together with the vertically movable column 112. The holding unit 116, the vertically movable column 112, and the driving unit are designed so that the holding unit 116 rotates around the rotation axis substantially coinciding with the vertical central axis of the vertically movable column 112 when one of the plurality of motors forming the driving unit is operated. By operating the operation unit 130 to rotate the holding unit 116, the operator can avoid contact of the soldering iron 115 with an electronic component on the substrate. Since both the solder feeding unit 114 and the soldering iron 115 are attached to the holding unit 116, a relative positional relationship of these does not change during the rotation of the holding unit 116. Any structure known in the art may be applied to a design of the holding unit 116, the vertically movable column 112, and the driving unit. Therefore, the principle of the present embodiment is not limited to a specific coupling structure among the holding unit 116, the vertically movable column 112, and the driving unit.

The holding unit 116 includes an arcuate plate 117 to which the soldering iron 115 is attached. An arcuate slot 118 is formed in the arcuate plate 117. The operator can change an attachment position of the soldering iron 115 along the slot 118 and adjust a tilt angle of the soldering iron 115 with respect to an upper surface of the substrate on the installation base 125. Scale marks (not shown) may be applied along the slot 118. In this case, the operator can understand the tilt angle of the soldering iron 115 numerically.

The heating control unit 140 is used to control the temperature of the iron tip of the soldering iron 115. Any feedback control technique known in the art can be applied to the temperature control executed between the heating control unit 140 and the soldering iron 115. Therefore, the principle of the present embodiment is not limited to a specific temperature control technique performed between the heating control unit 140 and the soldering iron 115.

A solder bobbin 119 around which the thread solder 113 is wound is attached to an upper end of the vertically movable column 112. The thread solder 113 extends from the solder bobbin 119 to the solder feeding unit 114. When soldering is performed, the solder feeding unit 114 supplies solder to the iron tip (or near the iron tip) of the soldering iron 115. As a result, the solder is melted at the iron tip (or near the iron tip) of the soldering iron 115. Any structure of a solder feeding mechanism known in the art can be applied to the solder feeding unit 114. Therefore, the principle of the present embodiment is not limited to a specific structure of the solder feeding unit 114.

The operation unit 130 includes a housing 131, a left lever 132, a right lever 133, and a coordinate input section 134. The operator can tilt the left lever 132 and the right lever 133 projecting from an upper surface of the housing 131 to move the soldering iron 115 and the installation base 125. The operator can operate the coordinate input section 134 to input, to the soldering apparatus 100, a coordinate value representing a position of the iron tip in a coordinate spatial set for arithmetic processing to be executed by the soldering apparatus 100. Arithmetic processing refers to a process by which coordinate values are translated to control signals for controlling the driving unit 180 to move the soldering iron tip. Various electronic components for generating electric signals representing tilt amounts of the left lever 132 and the right lever 133 and the operation performed on the coordinate input section 134 are disposed in the housing 131.

The operator can incline the left lever 132 and the right lever 133 projecting from the upper surface of the housing 131 to designate a change direction of relative positions between the substrate on the installation base 125 and the iron tip of the soldering iron 115. The left lever 132 is used to move the iron tip of the soldering iron 115 in the z-axis direction (that is, upward and downward movement of the iron tip) and to rotate the holding unit 116 (that is, circular movement of the iron tip of the soldering iron 115 around the rotation axis of the holding unit 116). The right lever 133 is used to move the iron tip of the soldering iron 115 in the x-axis direction (that is, leftward and rightward movement of the iron tip) and to move the installation base 125 in the y-axis direction (that is, relative forward and rearward movement of the iron tip with respect to the substrate on the installation base 125). The following table shows an exemplary correspondence relationship of the operation of the soldering apparatus 100 with respect to the operation of the left lever 132 and the right lever 133.

TABLE 1

| Operation | Left lever | Right lever |
|---|---|---|
| Tilt forward | Lower iron tip | Move installation base forward |

TABLE 1-continued

| Operation | Left lever | Right lever |
|---|---|---|
| Tilt rearward | Raise iron tip | Move installation base rearward |
| Tilt rightward | Rotate iron tip clockwise | Move iron tip rightward |
| Tilt leftward | Rotate iron tip counterclockwise | Move iron tip leftward |

In the present embodiment, the coordinate input section 134 is designed as a general pressing button. Therefore, the operator can perceive reaction force received from the pressing button with a fingertip to judge whether or not the pressing button has been operated.

The input interface 150 is used to display various data and to input various data and instructions to the soldering apparatus 100. A touch panel may be used as the input interface 150. For example, the input interface 150 can display coordinate values input by the operator's operation of the coordinate input section 134.

<Functional Configuration>

Figure 2:
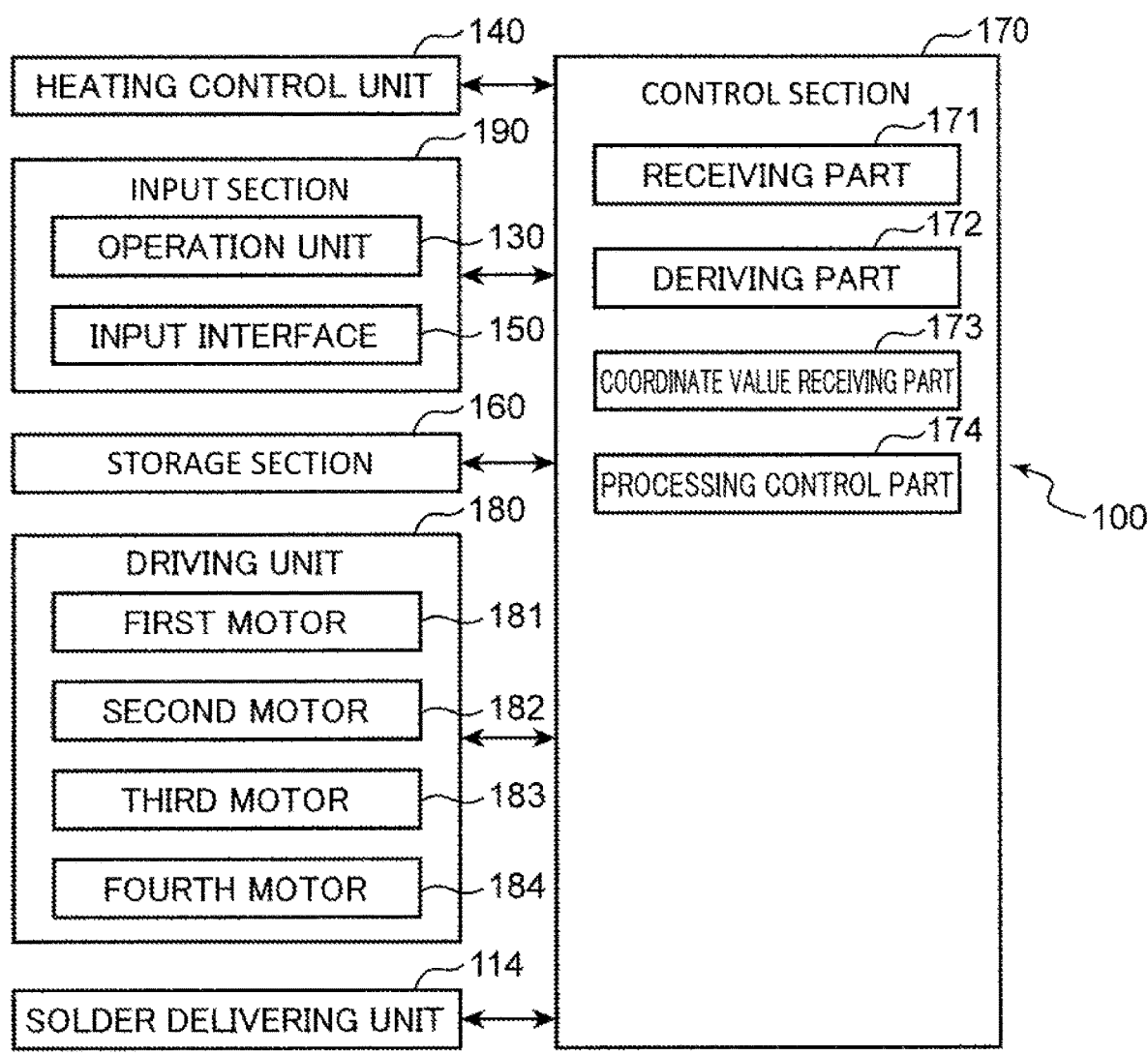
FIG. 2 is a schematic block diagram of the soldering apparatus.

FIG. 2 is a schematic block diagram of the soldering apparatus 100. With reference to FIGS. 1 and 2, a functional configuration of the soldering apparatus 100 will be described. The soldering apparatus 100 includes the heating control unit 140 and the solder feeding unit 114 described above, and an input section 190, a storage section 160, a driving unit 180, and the control section 170.

FIG. 2 shows the operation unit 130 and the input interface 150 described with reference to FIG. 1 as the input section 190. The input section 190 is used to display various data and to input various data and instructions to the soldering apparatus 100.

The storage section 160 stores various data used in the soldering apparatus 100. The storage section 160 is configured with a storage device such as a memory, an HDD (Hard Disk Drive), an SSD (Solid State Drive), or the like.

The driving unit 180 includes a first motor 181, a second motor 182, a third motor 183, and a fourth motor 184. Under the control of the control section 170, the first motor 181 rotates the holding unit 116 so that the iron tip of the soldering iron 115 rotates counterclockwise or clockwise. The second motor 182 lowers or raises the vertically movable column 112 under the control of the control section 170. As a result, the iron tip of the soldering iron 115 attached to the vertically movable column 112 via the holding unit 116 also lowers or rises. The third motor 183 moves the horizontally movable column 111 leftward or rightward under the control of the control section 170. Since the soldering iron 115 is attached to the horizontally movable column 111 via the holding unit 116 and the vertically movable column 112, the iron tip of the soldering iron 115 can also move leftward or rightward together with the horizontally movable column 111. The fourth motor 184 moves the installation base 125 forward or rearward under the control of the control section 170. As a result, a relative position of the iron tip of the soldering iron 115 with respect to the substrate on the installation base 125 changes forward or rearward.

In other words, during the movement of the soldering iron 115 in the left-right (x-axis) direction and the up-down (z-axis) direction and the rotation of the soldering iron 115 around the rotation axis of the holding unit 116, the soldering iron 115 actually moves. On the other hand, the soldering iron 115 does not actually move in the front-rear (y-axis) direction, but instead the installation base 125 moves in the front-rear direction. While the installation base 125 moves in the front-rear direction, the soldering iron 115 can be relatively displaced in the front-rear direction with respect to the substrate. In the present embodiment, the movement of the soldering iron 115 means not only the actual movement of the soldering iron 115 but also the relative movement of the soldering iron 115 with respect to the surface of the substrate.

An encoder (not shown) for detecting a rotation amount of the motor is attached to each of the first, second, third and fourth motor 181, 182, 183, 184. The encoder outputs the detected rotation amount to the control section 170. The control section 170 performs feedback control on the first, second, third and fourth motor 181, 182, 183, 184 with reference to the rotation amount output from each of the encoders. Each of the motors 181, 182, 183 and 184 are non-limiting examples of a motor configured to move soldering iron 115 relative to a system origin point. An example of a system origin point is Pa0 in FIG. 7, which will be discussed later.

The control section 170 controls the each portion of the soldering apparatus 100. The control section 170 is configured by a microcomputer provided with a CPU, a RAM, a ROM, and the like. In the microcomputer, when the CPU executes a control program stored in the ROM or the like, the control section 170 functions as, for example, a receiving part 171, a deriving part 172, a coordinate value receiving part 173, and a processing control part 174. As used herein, the term "computer" encompasses a microcomputer. The term "computer" encompasses a single computer that performs the process steps described herein. The term "computer" encompasses a plurality of computers configured to operate together to perform the process steps described herein. The memory of the computer, such as RAM and ROM, include a non-transitory computer readable medium storing instructions which when executed by the computer of soldering apparatus 100, cause the computer to perform the process steps described herein.

The receiving part 171 receives input of various data and instructions from the input section 190 used by an operator. The deriving part 172, by using the substrate's gerber data previously stored in the storage section 160, derives coordinate values of portions of the substrate (e.g., physical features such as holes) that are prospective soldering targets. The coordinate values (referred to as "system coordinates" herein) define a position in space (three-dimensional space). The system coordinates are used for arithmetic processing to be executed by the soldering apparatus 100 to control the driving unit 180. The coordinate value receiving part 173 accepts user editing input for changing the system coordinates derived by the deriving part 172. Further, the coordinate values receiving part 173 accepts user selection input for selecting a subset of the system coordinates which were derived by deriving part 172 and which may or may not have been edited by the user. The selected subset of system coordinates will eventually be used to perform a soldering process on a substrate. The subset of system coordinates are selected out from the entire set of system coordinates derived by the deriving part 172. That is, the computer of the control section 170 controls one or more motors (e.g., motor 181, 182, 183, and/or 184) according to the selected subset of the derived system coordinates, instead of according to all the derived system coordinates, in order to perform the soldering process on the substrate. Still further, the coordinate value receiving part 173 accepts system coordinates that are input by the user via the operation unit 130.

When the receiving part 171 receives an instruction to execute soldering, the processing control part 174 controls the driving unit 180 so as to move the soldering iron 115 to the system coordinates of the soldering target positions accepted by the coordinate values receiving part 173, by using a certain algorithm designed to move the iron tip of the soldering iron 115 to the system coordinates. Further, when the tip of the soldering iron 115 exists at the soldering target positions defined by the system coordinates received by the coordinate values receiving part 173, the processing control part 174 controls the solder feeding unit 114 to feed a predetermined amount of thread solder 113 to the iron tip. As a result, soldering is automatically performed at the soldering target positions defined by system coordinates.

Any soldering iron drive control technique known in the art can be applied to drive control of the soldering iron 115 performed between the processing control part 174 and the driving unit 180. In addition, any solder feed control technique known in the art can be applied to solder feed control performed between the processing control part 174 and the solder feeding unit 114. Therefore, the principle of the present embodiment is not limited to a specific drive control of the soldering iron 115 performed between the processing control part 174 and the driving unit 180 and is not limited to a specific solder delivery control performed between the processing control part 174 and the solder feeding unit 114.

<Receiving Method>

Figure 3:
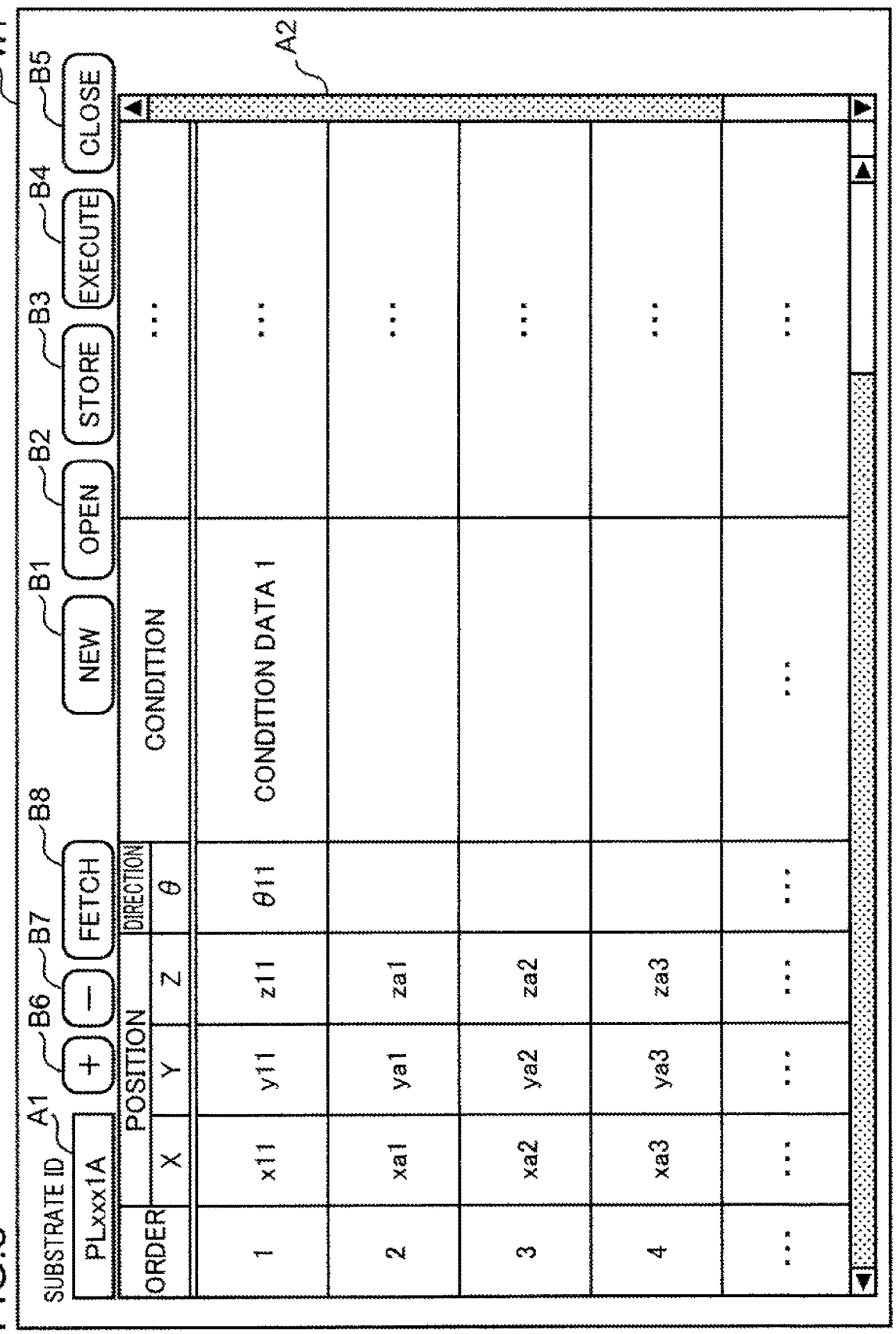
FIG. 3 is a diagram showing an example of an editing operation screen of data relating to soldering.

Hereinafter, a receiving method in the receiving part 171 and the coordinate value receiving part 173 will be described in detail. FIG. 3 is a diagram showing an example of an editing operation screen W1 of data relating to soldering. The receiving part 171 and the coordinate value receiving part 173 receive user data input, user editing input, and user selection input provided by the user to the editing operation screen W1 displayed on the input interface 150. These inputs are provided by the user via the operation unit 130 or the input interface 150.

When an operator inputs an instruction to start editing of data relating to soldering control by using the input interface 150, the receiving part 171 receives the instruction and displays the editing operation screen W1 as shown in FIG. 3 on the input interface 150. As shown in FIG. 3, the editing operation screen W1 includes editing fields A1 and A2 and eight soft keys B1 to B8.

The editing field A1 is an editing field of a substrate ID (for example, "PLxxx1A") for identifying a substrate to be soldered. In the editing field A1, the substrate ID is manually entered by the operator using the input interface 150.

The editing field A2 is an editing field of data showing a soldering target position on the substrate identified in the editing field A1 and shows parameters of soldering to be done at the target position. The editing field A2 includes an order field, a position data editing field, a direction data editing field, a condition data editing field, and the like in order from the left in FIG. 3.

In the order field, an order of soldering (for example, 1, 2, 3 . . . ) within the substrate is displayed. The row labeled by numeral 1 contains system coordinates and soldering parameters for a first soldering target, the row labeled by numeral 2 contains system coordinates and soldering parameters for a second soldering target, and so on. In row 1, the system coordinates in the x-, y-, and z-axes are labeled x11, y11, z11, respectively. In row 2, the system coordinates in the x-, y-, and z-axes are labeled xa1, ya1, za1, respectively. It is to be understood that these labels are for purposes of illustration only. For example (x11, y11, z11) may actually be (23, 124, 32), and (xa1, ya1, za1) may actually be (23, 305, 32). These values may be in millimeters or other unit of measure that is recognized by the soldering apparatus 100.

In the position data editing field, when the operator operates the input interface 150 or the operation unit 130, a three-dimensional coordinate value (for example, x11, y11, z11) representing the system coordinates of a soldering target is entered and/or edited.

In the direction data editing field, when the operator operates the input interface 150 or the operation unit 130, an angle (for example, θ11) at which the holding unit 116 is rotated is entered and/or edited. In other words, in the direction data editing field, editing may be performed on an angle at which the iron tip of the soldering iron 115 is circularly moved around the rotation axis of the holding unit 116.

In the condition data editing field, when the operator operates the input interface 150, condition data (for example, condition data 1) representing soldering parameters are entered and/or edited. Specifically, when the condition data editing field is clicked, the receiving part 171 displays a condition editing screen (not shown) on the input interface 150. In the condition editing screen, for example, the soldering parameters such as the number of times of soldering, timing of soldering, amount of solder to supply, moving speed of the soldering iron 115, and the like are entered and/or edited.

The soft key B1 is a soft key for entering new teaching data. As used herein, the term "teaching" refers to programming or storing, in the sense that the soldering apparatus 100 is being taught or programmed. The term "teaching data" refers to data that is programmed or stored into the soldering apparatus 100. When the operator clicks the soft key B1 by operating the input interface 150, the receiving part 171 receives an instruction to clear all data that is currently present in the editing fields A1 and A2. As a result, new teaching data can be entered in the editing operation screen W1.

The soft key B2 is a soft key for importing teaching data (system coordinates and condition data) from the storage section 160. When the operator clicks the soft key B2 by operating the input interface 150, the receiving part 171 receives an instruction to read the teaching data, and displays a selection screen in which substrate IDs already stored in the storage section 160 are displayed in a list form so that a substrate ID is selectable by the user. When a desired substrate ID is selected by the user in the selection screen, the receiving part 171 reads out the teaching data associated with the selected substrate ID from the storage section 160, and displays the read teaching data in the editing field A2. That is, the editing field A2 is populated with teaching data (system coordinates and condition data) that was previously stored. As a result, it is possible to edit previously stored teaching data on the editing operation screen W1.

The soft key B3 is a soft key for storing, in the storage section 160, the substrate ID present in the editing field A1 and the teaching data present in the editing field A2. The teaching data (system coordinates and condition data) present in the editing field A2 are stored in association with the substrate ID in the editing field A1. When the operator clicks on the soft key B3 by operating the input interface 150, the receiving part 171 receives an instruction to register the teaching data, and stores, in the storage section 160, the substrate ID present in the editing field A1 and the teaching data present in the editing field A2 in association with each other. As a result, the substrate ID and the teaching data can be newly stored in the storage section 160 in association with each other.

The soft key B4 is a soft key for executing a soldering process in accordance with the teaching data displayed in the editing field A2. When the operator clicks the soft key B4 by operating the input interface 150, the receiving part 171 receives an instruction to execute soldering. At this time, the coordinate value receiving part 173 receives the teaching data displayed in the editing field A2. The processing control part 174 causes the driving unit 180 to move the soldering iron 115 and causes the solder feeding unit 114 to feed the solder according to the teaching data received by the coordinate value receiving part 173.

Specifically, the processing control part 174 controls the driving unit 180 so that the tip of the soldering iron 115 moves to system coordinates displayed in the editing field A2. The system coordinates are for a sequence of soldering targets, as previously described. When the tip of the soldering iron 115 is at a soldering target, the processing control part 174 controls the solder feeding unit 114 such that a predetermined amount of the thread solder 113 is fed to the iron tip. Data for the predetermined amount is included in the condition data displayed in the editing field A2. As a result, soldering is automatically performed at the soldering targets represented by the respective rows of teaching data (system coordinates and condition data) displayed in the editing field A2.

The soft key B5 is a soft key for closing the editing operation screen W1. When the operator clicks the soft key B5 by operating the input interface 150, the receiving part 171 receives an instruction to end the editing operation using the editing operation screen W1 and removes the editing operation screen W1 from the display screen of the input interface 150.

The soft key B6 is a soft key for adding a soldering target. For example, the soft key B6 is clicked after the operator clicks on any one of the order fields by operating the input interface 150 to select a soldering target (for example, selecting the third soldering target by clicking the order field where "3" is displayed). In this case, the receiving part 171 receives an instruction to add a soldering target, and adds a blank row before (above) the row of the selected soldering target. Then, the receiving part 171 displays an order number in the order field of the added blank row, according to the order displayed in the selected order field (for example, displays "3" in the order field of the added blank row). Thereafter, teaching data (system coordinates and condition data) may be added to the blank row based on user inputs. The receiving part 171 updates the order of subsequent (lower) rows by incrementing their order (for example, by changing the order number of subsequent rows from "3" and "4" to "4" and "5").

The soft key B7 is a soft key for deleting a selected soldering target. For example, the operator clicks on any of the order fields by operating the input interface 150 in order to select a soldering target (for example, selecting the second soldering target by clicking the order field where "2" is displayed). Thereafter, the operator clicks on soft key B7. As a result, the receiving part 171 receives an instruction to delete the selected soldering target. This is achieved by deleting the corresponding row in the editing field A2. As a result, the soldering target corresponding to the selected display field is deleted. The receiving part 171 updates the order of subsequent (lower) rows by decrementing their order (for example, by changing the order number of subsequent rows from "3" and "4" to "2" and "3").

The soft key B8 is a soft key for executing a gerber data fetching process. As will be described in more detail later, the gerber data fetching process includes: selecting gerber data to be received by the computer of the control section 170; extracting from the received gerber data, the substrate coordinates of at least one of the physical features of the substrate; and using the extracted substrate coordinates to derive system coordinates for the at least one of the physical features of the substrate, the system coordinates for the at least one of the physical features being relative to the system origin point. Non-limiting examples of physical features of the substrate include a drill hole, copper foil, and the like. The editing field A2 is populated with the derived system coordinates. Within the editing field A2, the user has the option of entering user editing inputs (via the input interface 150) to change the derived system coordinates to generate changed system coordinates that will be used for a soldering process. The user also has the option of entering user selection inputs (for example, pressing the soft key B7) to remove some of the derived system coordinates in order to select a subset of the system coordinates that will be used for a soldering process.

Specifically, in the storage section 160, gerber data representing the shape and the position of physical features on a substrate may be stored in a plurality of electronic files. For example, the gerber data of one type of physical feature present on the substrate, such as lettering and line drawings printed on the substrate surface, may be stored in one electronic file. The gerber data of another type of physical feature present on the same substrate, such as a region where no solder resist (solder mask) is formed, may be stored in a second electronic file. The gerber data of other types of physical features present on the same substrate, such as a drill hole and a copper foil (wiring), may be stored in third and fourth electronic files. These electronic files are stored in the storage section 160.

FIG. 4 is a diagram showing an example of contents of an electronic file of gerber data. The gerber data includes definitions of a plurality of physical features of a substrate. The definitions include substrate coordinates for each of the physical features relative to a substrate origin point on the substrate. An example of a substrate origin point is Pb0 in FIG. 7, which will be discussed later. In the example of FIG. 4, the physical features are drill holes that are present on the substrate. The gerber data includes an indication of a unit of measure (e.g., DISTANCE UNIT: INCH), and indication of a type of physical feature (e.g., TYPE: DRILL HOLE) for which definitions are provided. The gerber data include definitions for various drill holes. As discussed below, the definitions include substrate coordinates for each of the physical features relative to a substrate origin point.

In FIG. 4, there are a plurality of drill holes identified by D10, which have diameter d10, are plated holes, and are circular. Substrate coordinates for drill holes D10 are provided. For example, drill holes D10 are located at substrate coordinates (xb101, yb101), (xb102, yb102), (xb103, yb103), and so on. Each of the substrate coordinates are two-dimensional coordinates that consist of two values that define a position on a plane. The substrate coordinates are relative to a substrate origin point (0,0). The substrate origin point may be located at one corner of the substrate, such as point Pb0 in FIG. 7. For example, xb101 may represent 1.59 inches from Pb0 along the x-axis, and yb101 may represent 2.30 inches from Pb0 along the y-axis. In addition, the definitions for these drill holes include identifiers for physical feature type, such as a general identifier (e.g., TYPE: DRILL HOLE), a group identifier (e.g., "D10"), and a shape identifier (e.g., "plated hole" or "circular").

In FIG. 4, there are a plurality of drill holes identified by D11, which have diameter d11, are plated holes, and are circular. Drill holes D11 are located at substrate coordinates (xb111, yb111), (xb112, yb112), and so on, which are relative to the substrate origin point. In addition, the definitions for these drill holes include identifiers for physical feature type, such as the general identifier (e.g., TYPE: DRILL HOLE), a group identifier (e.g., "D11"), and a shape identifier (e.g., "plated hole" or "circular").

In FIG. 4, there are a plurality of drill holes identified by D12, which have diameter d12, are plated holes, and are rectangular. Drill holes D12 are located at substrate coordinates (xb121, yb121), (xb122, yb122), and so on, which are relative to the substrate origin point. In addition, the definitions for these drill holes include identifiers for physical feature type, such as the general identifier (e.g., TYPE: DRILL HOLE), a group identifier (e.g., "D11"), and a shape identifier (e.g., "plated hole" or "rectangular").

<Operation of Fetching Gerber Data>

Figure 5:
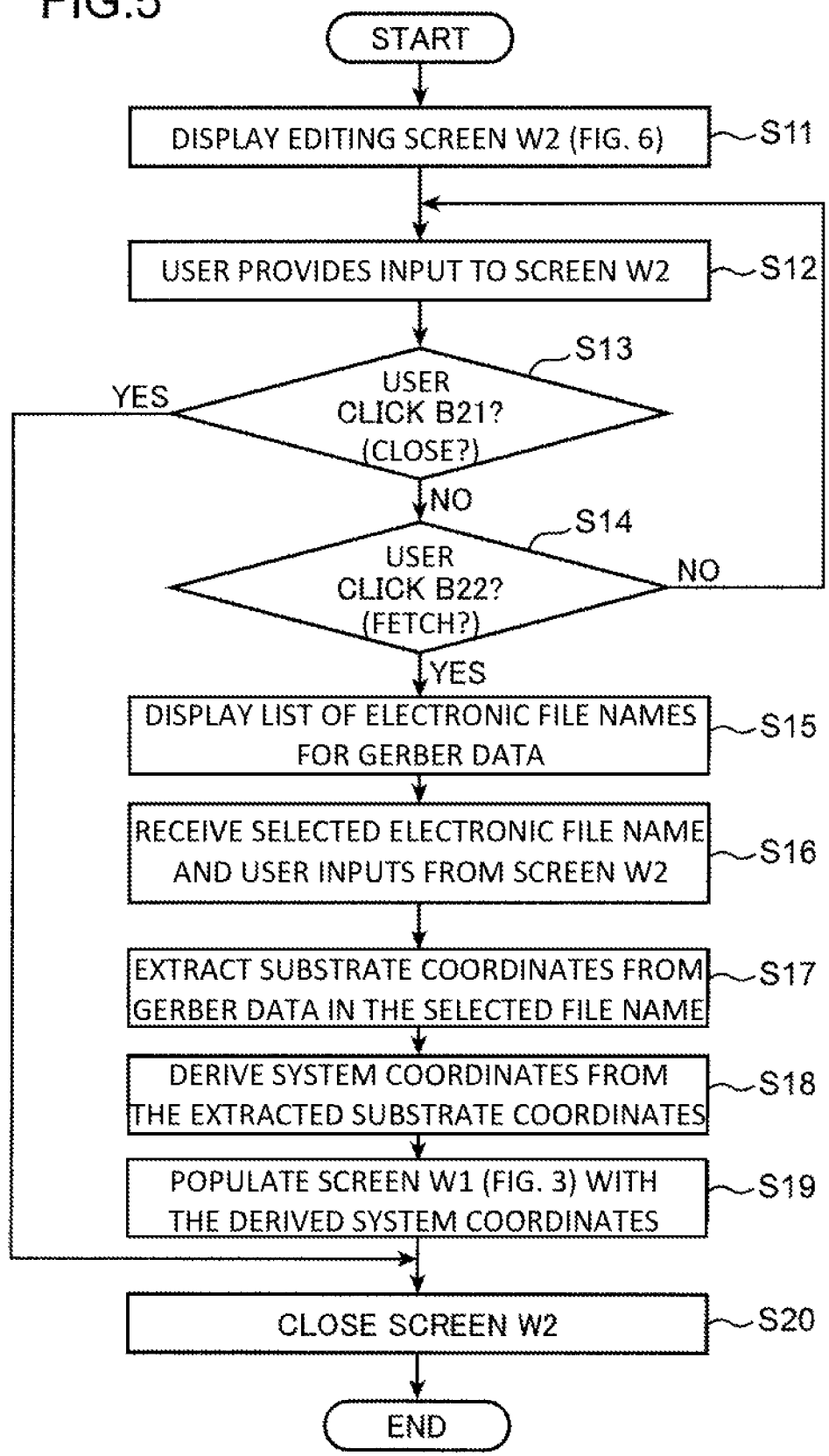
FIG. 5 is a flowchart showing an example of an operation of fetching the gerber data.
Figure 6:
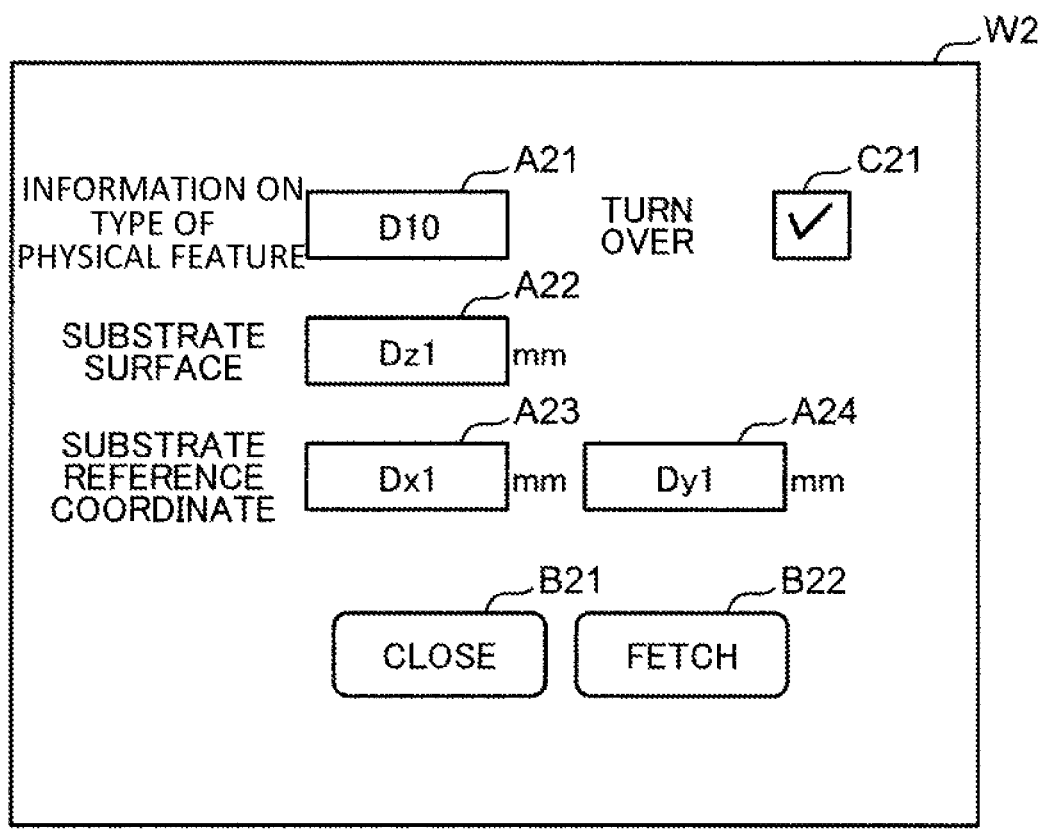
FIG. 6 is a diagram showing an example of an editing operation screen of data relating to the gerber data fetching.

Hereinafter, an example gerber data fetching process will be described with reference to FIGS. 5 and 6, and the like. FIG. 5 is a flowchart showing an example of the operation of fetching the gerber data. FIG. 6 is a diagram showing an example of the editing operation screen W2 of data relating to the gerber data fetching.

When the operator clicks the soft key B8 by operating the input interface 150, as shown in FIG. 5, the receiving part 171 receives an instruction to prepare for gerber data fetching. Upon receipt of the instruction, the receiving part 171 displays (step S11), on the input interface 150, an editing operation screen W2 (FIG. 6). The operator provides user input (step S12) that enables gerber data fetching. The user input is received by the computer of the control section 170.

As shown in FIG. 6, the editing operation screen W2 includes four editing fields A21 to A24, a selection field C21, and two soft keys B21 and B22.

The editing field A21 is an editing field that allows the user to input (via input interface 150) an information on physical feature type to select physical features that the user deems to be soldering target candidates from among other types of physical features of the substrate. For example, FIG. 6 shows an example in which the user has entered "D10" as information on physical feature type. In effect, the user has identified soldering target candidates as being the physical features corresponding to the group identifier D10.

The editing field A22 is an editing field that allows the user to input (via input interface 150 or operation unit 130) system coordinates for the substrate coordinate point. As used herein, system coordinates are relative to a system origin point which is predefined within the software and/or hardware of the control section 170. As used herein, substrate coordinates are relative to a substrate origin point which is predefined for a given substrate. The substrate origin point is different from the system origin point. The substrate origin point is defined by the substrate coordinates in the gerber data. For instance, substrate coordinates (xb101, yb101) in FIG. 4 may represent (1.59, 2.30), thereby defining the substrate origin point as being located at 1.59 inches along the x-axis and 2.30 inches along the y-axis away from one of the drill holes on the substrate. In FIG. 6, the user inputs x-axis, y-axis, and z-axis values for system coordinates (Dx1, Dy1, Dz1) into fields A23, A24, and A22, respectively. The computer of the control section 170 receives system coordinates (Dx1, Dy1, Dz1) for the substrate origin point. The computer receives (Dx1, Dy1, Dz1) separately from the gerber data. Note that (Dx1, Dy1, Dz1) are not included in the gerber data.

Note that, after setting the substrate on the installation base 125, the operator may operate the left lever 132 and the right lever 133 (FIG. 1), and move the tip of the soldering iron 115 to the substrate origin point, and then, operate the coordinate input section 134 (FIG. 1). Thus, the operator can easily input the system coordinates (Dx1, Dy1, Dz1) for the substrate origin point without having to manually enter numerical values.

The selection field C21 is a selection field that allows the user to indicate whether the substrate, when placed on the installation based 125, is upside down. The user may enter (via input interface 150) a check mark in field C21 to indicate that the substrate is flipped over along the y-axis so as to be oriented upside down. The check mark is an example of inversion information, which the computer of the control section 170, uses to derive system coordinates for one or more physical features, as will be described later.

The soft key B21 is a soft key for terminating the gerber data fetch process and closing the editing operation screen W2. The soft key B22 is a soft key for inputting an instruction to proceed with gerber data fetching.

Referring back to FIG. 5, when the operator clicks the soft key B21 by operating the input interface 150 in the middle of step S12 (YES in step S13), the receiving part 171 receives an instruction to abort the operation of fetching the gerber data, and the receiving part 171 closes (makes non-display of) the editing operation screen W2 (step S20). While the soft key B21 is not clicked (NO in step S13) and the soft key B22 is not clicked (NO in step S14), the process returns to step S12 to allow the user to finish providing desired inputs in the editing operation screen W2 (FIG. 6).

When the user has finished providing desired inputs in the editing operation screen W2 (FIG. 6) and then clicks soft key B22 (YES in step S14), the receiving part 171 receives an instruction to proceed with the gerber data fetching. Upon receiving the instruction, the receiving part 171 displays, on the input interface 150, an editing screen (not shown) in which electronic file names of the gerber data stored in the storage section 160 are displayed in a list. By operating the input interface 150, the operator can select an electronic file name from the list (step S15).

After the user has selected an electronic file name, the receiving part 171 receives (step S16) the electronic file name, information on a type of physical feature to be soldered (which the user entered in field A21 of screen W2), system coordinates for the substrate origin point (which the user entered into fields A22 to A24), and any inversion information (possibly a check mark entered to field C21).

After step S16, the deriving part 172 reads an electronic file from the storage section 160. The electronic file corresponds to the electronic file name selected by the user and received by the receiving part 171. Then, the deriving part 172 specifies, as soldering target candidates, the physical features on the substrate that are represented by the information on type (e.g., "D10" entered in field A21 of FIG. 6). Then, the deriving part 172 extracts (step S17) the substrate coordinates (for example, (xb101, yb101), (xb102, yb102), (xb103, yb103)) of the physical features that are of a type that corresponds to the received information on type. This may be accomplished by the computer of the control section 170 comparing the received information on type (e.g., "D10" entered into field A21) to the various identifiers for physical feature type (e.g., D10, D11, D12 of FIG. 4) in the gerber data, such that the extracted substrate coordinates (e.g., (xb101, yb101), (xb102, yb102), (xb103, yb103)) are for physical features that are of a type that corresponds to the received information.

Next, using the extracted substrate coordinates (e.g., (xb101, yb101), (xb102, yb102), (xb103, yb103)) for physical features from step S17 and the system coordinates (e.g., (Dx1, Dy1, Dz1)) for the substrate origin point from step S16, the deriving part 172 derives (step S18) system coordinates (e.g., (xa1, ya1, za1), (xa2, ya2, za2), (xa3, ya3, za3)) for the same physical features. Recall that system coordinates are relative to the system origin point that is predefined within the software and/or hardware of the control section 170, and substrate coordinates are relative to a substrate origin point that is predefined for the substrate. Details of step S18 will be described later.

Then, the deriving part 172 adds (step S19) the derived system coordinates (e.g., (xa1, ya1, za1), (xa2, ya2, za2), (xa3, ya3, za3)) from step S18 as position data in the editing field A2 of the editing operation screen W1 (FIG. 3). That is, the deriving part 172 populates position fields of the screen W1 with the derived system coordinates. Thereafter, the process proceeds to step S210 where the gerber data fetching process ends and editing screen W2 (FIG. 0.6) is closed and removed from the display screen of the user interface 150.

Note that, after step S19, the user may edit derived system coordinates which are displayed in the editing operation screen W1. Note that the derived system coordinates are positions of soldering target candidates. Also note that each of the derived system coordinates are three-dimensional coordinates that consist of three values that define a position in a three-dimensional space. For example, when the operator desires to perform soldering at positions above the derived system coordinates, the operator can edit the z-axis values of the derived system coordinates to produce changed system coordinates. The editing operation screen W1 allows the operator to edit the three-dimensional coordinates that were derived by the deriving part 172 in step S18 so as to enter three-dimensional coordinates where soldering will actually be performed. The computer of control section 170 receives these user editing inputs, and the changed system coordinates are displayed in the editing operation screen W1. In addition, the operator can enter and/or edit data in the direction data editing field and the condition editing field in the rows for the derived system coordinates.

After editing is performed by the operator, for example, the soft key B4 in the editing operation screen W1 is clicked, and the receiving part 171 receives an instruction to execute soldering. Here, the coordinate values receiving part 173 receives teaching data shown in the editing operation screen W1.

Further, in the editing operation screen W1, the user has the option of deleting any of the derived system coordinates. To delete a set of derived system coordinates, the operator clicks on one of the order fields (i.e., selects a soldering target) corresponding to the position data editing field populated by derived system coordinates, and then clicks the soft key B7. As a result, control section 170 deletes the selected soldering target. In effect, pressing the soft key B7 provides the control section 170 with user selection input for selecting soldering targets. For example, screen W1 can show system coordinates that were derived for the first, second, third and fourth soldering targets. The operator clicks on numeral "2" in the order field in screen W1 to select the second soldering target. Next, when the operator clicks on soft key B7, the second soldering target is deleted from screen W1, and the remaining soldering targets are the first, third, and fourth. The system coordinates that were derived for the first, third, and fourth soldering targets are referred to as a subset of the derived system coordinates. In other words, when the user presses the soft key B7, the control section 170 receives user selection input to select, from among the derived system coordinates, a subset of the derived system coordinates. The subset of derived system coordinates can then be used by the control section 170 to control one or more motors of the driving unit 180 in order to perform a soldering process.

It will be appreciated from the above description that, in the editing operation screen W1, the operator can select whether or not to leave the derived system coordinates to be positions of soldering targets. When the soft key B4 is clicked and the receiving part 171 receives an instruction to execute soldering, the coordinate values receiving part 173 receives the remaining system coordinates (e.g., the subset of system coordinates discussed above) in the editing field A2. In addition, when the operator operates the operation unit 130, the coordinate values receiving part 173 receives system coordinates for additional soldering targets.

According to the above configuration, it is possible to effectively reduce labor of the operator who inputs the soldering target positions. The operator may input system coordinates (e.g., (Dx1, Dy1, Dz1) in FIG. 6) for the substrate origin point and information on a type of physical feature (e.g., "D10" entered in field A21). Entry of the information on type has the potential advantage of preventing extraction of all the substrate coordinates in the gerber data, and limiting extraction of substrate coordinates for physical features on the substrate that are of interest to the operator. Thereafter, the operator may select a particular electronic file that contains gerber data that is appropriate for the substrate on which the operator is working. Upon selecting an electronic file name, the deriving part 172 can extract the substrate coordinates for only the physical features that are of a type that corresponds to the received information on type (e.g., "D10" entered in field A21). In other words, the candidates for soldering targets are narrowed down from the entire set of physical features defined in the gerber data to only the physical features that are of a type that corresponds to the received information on type (e.g., "D10" entered in field A21).

Therefore, even if the operator does not individually input system coordinates for soldering target positions, the operator can populate the position data fields in screen W1 with system coordinates for soldering target candidates by way of the above described gerber data fetching process (FIG. 5), optionally edit the system coordinates, and optionally make a selection from the soldering target candidates (i.e., select a subset of the derived system coordinates) by way of elimination using soft key B7. Therefore, the operator can efficiently input system coordinates for soldering targets. Therefore, the soldering apparatus 100 having the above configuration can effectively reduce the labor of the operator who inputs system coordinates for soldering targets.

<Coordinate Value Deriving Method 1>

Figure 7:
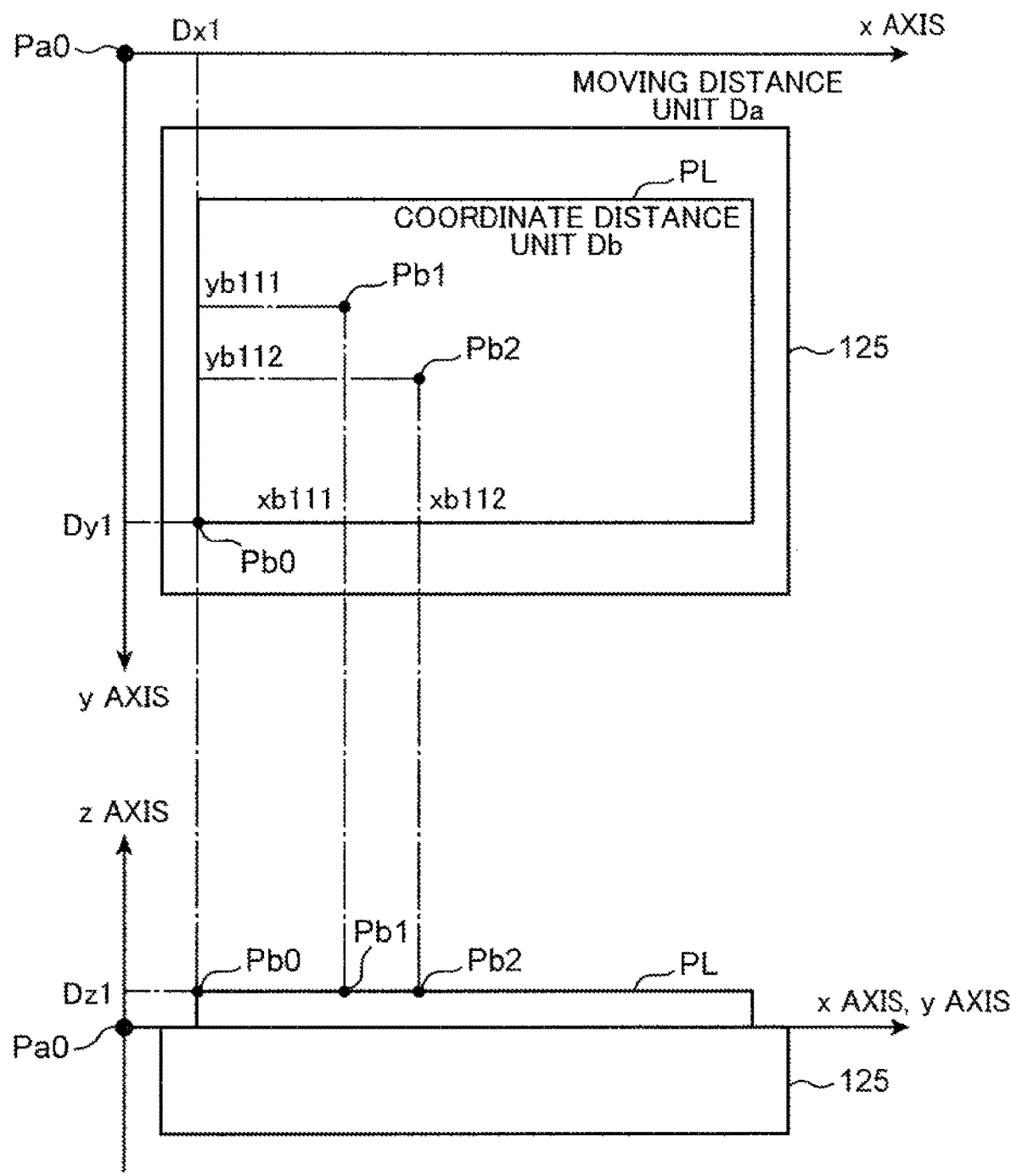
FIG. 7 is a diagram showing an example of coordinate values in a case where a substrate is placed without being turned over.

Next, a specific example of a method of deriving the three-dimensional system coordinates for at least one of the physical features on the substrate will be described in detail with reference to FIG. 7. FIG. 7 is a diagram showing an example in which a substrate PL is placed on installation base 125 without being turned over. As shown in FIG. 7, the system origin point Pa0 exists on a plane including the surface of the installation base 125. The x axis and the y axis of the soldering apparatus 100 are coordinate axes on the plane. The z axis of the soldering apparatus 100 is a coordinate axis orthogonal to the plane. The x, y, and z axes are mutually orthogonal.

The substrate origin point Pb0 is at one corner of the substrate PL. A symbol Da represents a unit amount of a distance (i.e., a unit of measure) for moving the soldering iron 115 in three-dimensional space. For example, Da could be equal to 1 millimeter. The moving distance unit Da is stored in advance in the storage section 160. Db represents a unit amount of a distance (i.e., a unit of measure) for the two-dimensional substrate coordinates in the gerber data. For example, Db could be equal to 1 inch as shown near the top of FIG. 4. The coordinate distance unit Db is included in each gerber data.

As shown in FIG. 7, the substrate PL has mutually orthogonal side edges. The substrate PL is set on the installation base 125 so its side edges are parallel to the x axis and the y axis of the soldering apparatus 100, and is set on the installation base 125 without being flipped over. In step S16 (FIG. 5), the receiving part 171 receives information on type of physical feature to be soldered. For example, "Dl i" may be entered into field A21 of screen W2 (FIG. 6). The receiving part 171 also receives system coordinates for the substrate origin point Pb0 as Dx1, Dy1, and Dz1 entered into fields A22 to A24 of screen W2. The receiving part 171 also receives an electronic file name of the gerber data shown in FIG. 4. In this example, the user did not enter a check mark in field C21 of screen W2 relating to inversion information.

In this case, in step S17 (FIG. 5), the deriving part 172 reads from the storage section 160 an electronic file corresponding to the received electronic file name. Then, the deriving part 172 specifies, as soldering target candidates, two physical features Pb1 and Pb2 (FIG. 7) of a type that corresponds to the received information on type (e.g., "D11" entered into field A21 of screen W2). Then, the deriving part 172 extracts substrate coordinates (e.g., (xb111, yb111), (xb112, yb112)) of physical features Pb1 and Pb2 (FIG. 7). Step S17 may be performed by the computer of the control section 170 by comparing the received information on type (e.g., "D11") to the various identifiers for physical feature type (e.g., D10, D11, D12 of FIG. 4) in the gerber data, such that the extracted substrate coordinates (e.g., (xb111, yb111), (xb112, yb112)) are for physical features that are of a type that corresponds to the received information on type.

Then, in step S18, the deriving part 172 derives three-dimensional system coordinates for physical features Pb1 and Pb2. Using Expression (1) below, the deriving part 172 computes the system coordinates of physical feature Pb1 as (Dx1+(Db/Da)×xb111, Dy1−(Db/Da)×yb111, Dz1). In performing the above computation, the deriving part 172 uses the extracted substrate coordinates (xb111, yb111) of Pb1 and the received system coordinates (Dx1, Dy1, Dz1) of the substrate origin point Pb0. Likewise, the deriving part 172 computes the system coordinates of physical feature Pb2 as (Dx1+(Db/Da)×xb112, Dy1−(Db/Da)×yb112, Dz2) using the Expression (1). Expression (1) is used when the user does not enter a check mark in field C21 of screen W2 relating to inversion information.

Mathematical Expression 1

$$\begin{pmatrix} xa \\ ya \\ za \end{pmatrix} = \begin{pmatrix} Dx \\ Dy \\ Dz \end{pmatrix} + \begin{pmatrix} Db/Da & & \\ & -Db/Da & \\ & & 0 \end{pmatrix} \begin{pmatrix} xb \\ yb \\ 0 \end{pmatrix} = \begin{pmatrix} Dx + (Db/Da) \times xb \\ Dy - (Db/Da) \times yb \\ Dz \end{pmatrix} \quad (1)$$

wherein, (xa, ya, za) are system coordinates for a physical feature on the substrate, (xb, yb) are substrate coordinates extracted from the gerber data for the physical feature, (Dx, Dy, Dz) are system coordinates of the substrate origin point Pb0, Da is the unit of measure for system coordinates, and Db is the unit of measure for substrate coordinates.

<Coordinate Value Deriving Method 2>

Next, another specific example of a method of deriving (in step S18) the system coordinates for at least one of the physical features on the substrate will be described in detail with reference to FIG. 8. As will be discussed below, the control section 170 receives inversion information based on user input. This is a useful feature since gerber data typically define physical features (such as drill holes) with respect to the top surface of a substrate. If the user wishes to attached a through-hole component at a drill hole on the substrate, it may be necessary to apply solder on the underside (back side) of the substrate. To apply solder on the underside, the user would orient the substrate upside down on the soldering apparatus 100. The inversion information allows the control section 170 to use the gerber data even when the substrate is upside down.

Figure 8:
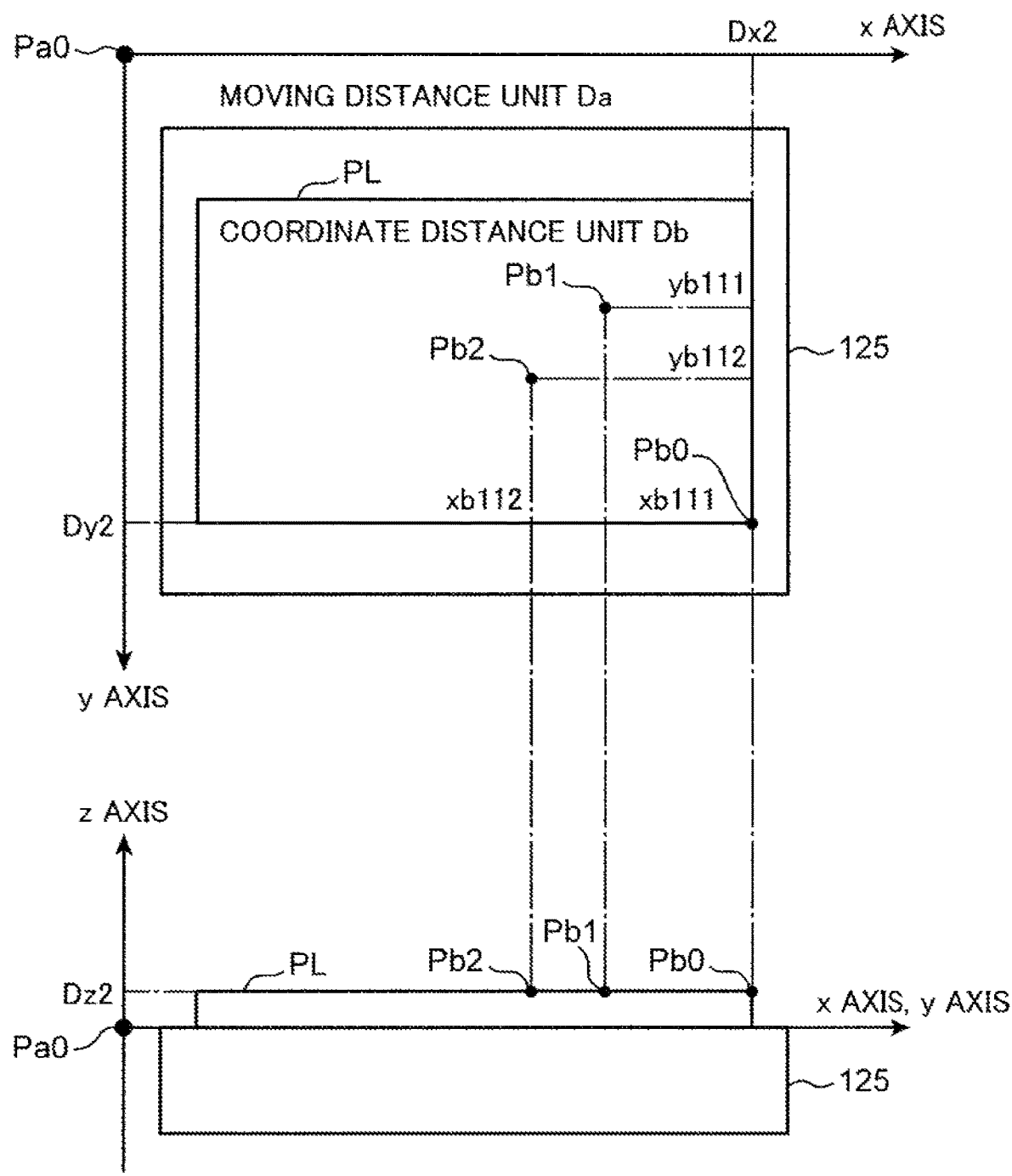
FIG. 8 is a diagram showing an example of coordinate values in a case where the substrate is placed by being turned over around a y axis.

FIG. 8 is a diagram showing an example in which the substrate PL is placed upside down on the installation base 125 by being turned over around the y axis, which is an example of a first axis of the soldering apparatus 100. The upside orientation of the substrate is evident from the fact that the substrate origin point Pb0 is located near to the bottom right corner of the installation base 125 in FIG. 8, compared to being located near to the bottom left corner of the installation base 125 in FIG. 7. The two sides of the substrate PL are mutually orthogonal and are parallel to the x axis and they axis of the soldering apparatus 100.

Then, in step S16, for example the receiving part 171 receives information on type of physical feature to be soldered. For example, "D11" may be entered into field A21 of screen W2 (FIG. 6). The receiving part 171 also receives system coordinates for the substrate origin point Pb0 as Dx2, Dy2, and Dz2 entered into fields A22 to A24 of screen W2. The receiving part 171 also receives an electronic file name of the gerber data shown in FIG. 4. Because the user flipped the substrate PL upside down, coordinates (Dx2, Dy2, and Dz2) differ from coordinates (Dx1, Dy1, and Dz1) in the previously example of FIG. 7. Also because the user flipped the substrate PL upside down, the user entered a check mark in field C21 of screen W2 relating to inversion information. The receiving part 171 received this inversion information.

In this case, in step S17, similarly to the above-described specific example of FIG. 7, the deriving part 172 extracts the substrate coordinates (e.g., (xb111, yb111), (xb112, yb112)) of physical features Pb1 and Pb2 (FIG. 8).

Then, in step S18, the deriving part 172 derives three-dimensional system coordinates for physical features Pb1 and Pb2. Due to the inversion information received by the receiving part 171, the deriving part 172 uses Expression (2) instead of Expression (1) to compute the system coordinates of physical feature Pb1 as (Dx2−(Db/Da)×xb111, Dy2−(Db/Da)×yb111, Dz2). In performing the above computation, the deriving part 172 uses the extracted substrate coordinates (xb111, yb111) of Pb1 and the received system coordinates (Dx2, Dy2, Dz2) of the substrate origin point Pb0. Similarly, the deriving part 172 computes the system coordinates for physical feature Pb2 as (Dx2−(Db/Da)×xb112, Dy2−(Db/Da)×yb112, Dz2) using the Expression (2).

Mathematical Expression 2

$$\begin{pmatrix} xa \\ ya \\ za \end{pmatrix} = \begin{pmatrix} Dx \\ Dy \\ Dz \end{pmatrix} + \begin{pmatrix} -Db/Da & & \\ & -Db/Da & \\ & & 0 \end{pmatrix} \begin{pmatrix} xb \\ yb \\ 0 \end{pmatrix} = \begin{pmatrix} Dx - (Db/Da) \times xb \\ Dy - (Db/Da) \times yb \\ Dz \end{pmatrix} \quad (2)$$

wherein, (xa, ya, za), (xb, yb), (Dx, Dy, Dz), Da, and Db are as described for Expression (1).

According to Expression (2), the x axis value of the derived system coordinates of physical feature Pb1 is xa=Dx−(Db/Da)×xb=Dx+(Db/Da)×−xb. This differs from the result of Expression (1), which would be xa=Dx+(Db/Da)×xb. The difference in result between Expression (1) and Expression (2) is in the positive/negative sign of xb. Therefore, Expression (2) is like using Expression (1) with the deriving part 172 inverting the positive/negative sign of the x axis value (e.g., xb111) of the extracted substrate coordinates of physical feature Pb1, and using the sign-inverted x axis value (e.g., −xb111) in Expression (1) to compute the system coordinates (e.g., (Dx2+(Db/Da)×(−xb111), Dy2−(Db/Da)×yb111, Dz2)).

From the above description, it will be understood that according to the inversion information, the deriving part 172 inverts a positive/negative sign of a value (e.g., xb111) in the extracted substrate coordinates in order to derive the system coordinates for at least one of the physical features of the substrate. Note that the value (e.g., xb111) is along a second axis (x axis) orthogonal to the first axis (y axis) about which the substrate is turned over.

Modified Embodiments

Note that the above embodiment is merely and is not intended to limit the present invention. For example, the following modified embodiments may be used.

(1) The selection field C21 may not be included in the editing operation screen W2 (FIG. 6), and the receiving part 171 may not be able to receive input of the inversion information.

(2) Similarly to the selection field C21, the editing operation screen W2 (FIG. 6) may be provided with a selection field for entering inversion information representing that the substrate is turned over around the x axis and installed on the installation base 125. The x axis (about which the substrate is turned over) is an example of a first axis of the soldering apparatus 100. In this case, when the receiving part 171 receives the inversion information in step S16, the deriving part 172, in step S18, may derive system coordinates by using the following Expression (3).

Mathematical Expression 3

$$\begin{pmatrix} xa \\ ya \\ za \end{pmatrix} = \begin{pmatrix} Dx \\ Dy \\ Dz \end{pmatrix} + \begin{pmatrix} Db/Da & & \\ & Db/Da & \\ & & 0 \end{pmatrix} \begin{pmatrix} xb \\ yb \\ 0 \end{pmatrix} = \begin{pmatrix} Dx + (Db/Da) \times xb \\ Dy + (Db/Da) \times yb \\ Dz \end{pmatrix} \quad (3)$$

wherein, (xa, ya, za), (xb, yb), (Dx, Dy, Dz), Da, and Db are as described for Expression (1).

According to Expression (3), the derived y axis value of the derived system coordinates of physical feature Pb1 is ya=Dy+(Db/Da)×yb. This differs from the result of Expression (1), which would be ya=Dy−(Db/Da)×yb=Dy+(Db/Da)×−yb. The difference in result between Expression (1) and Expression (3) is in the positive/negative sign of yb. Therefore, using Expression (3) is like using Expression (1) with the deriving part 172 inverting the positive/negative sign of y axis value of the extracted substrate coordinates of physical feature Pb1 (e.g., yb111), and using the sign-inverted y axis value (e.g., −yb111) in Expression (1) to compute the system coordinates (e.g., (Dx+(Db/Da)×xb111, Dy+(Db/Da)×−(−yb111), Dz)).

From the above description, it will be understood that according to the inversion information, the deriving part 172 inverts a positive/negative sign of a value (e.g., yb111) in the extracted substrate coordinates in order to derive the system coordinates for at least one of the physical features of the substrate. Note that the value (e.g., yb111) is along a second axis (y axis) orthogonal to the first axis (x axis) about which the substrate is turned over.

(3) The soft key B7 may not be included in the editing operation screen W1 (FIG. 3). Thereby, in step S19, there may be no ability to delete system coordinates for particular soldering target candidates. That is, the control section 170 may not receive a user selection input for selecting soldering targets. As previously discussed, a user selection input may be used by the control section 170 to select, from among the derived system coordinates, a subset of the derived system coordinates for controlling the one or more motors of the driving unit 180.

(4) The portion information edited in the editing field A21 of the editing operation screen W2 (FIG. 6) is not limited to the above-described information on a type of physical feature (e.g., "D10," "D11," or "D12"). Other information on a type of physical feature may be entered into field A21 and received by the receiving part 171. For example, "plated hole" or other phrase may be entered into field A21 as information on a type of physical feature. In such as case (e.g., "plated hole" entered into field A21), the information on a type of physical feature indicates a shape (e.g., hole) of the physical feature. Thus, step S17 (FIG. 5) may be performed by the computer of the control section 170 by comparing the received information on type (e.g., "plated hole") to the various identifiers for physical feature type (e.g., PLATED HOLE in FIG. 4) in the gerber data, such that the extracted substrate coordinates are for physical features (e.g., D10, D11, and D12) of the indicated shape (e.g., hole).

(5) The editing field A21 may not be included in the editing operation screen W2 (FIG. 6), and in step S17, the deriving part 172 may extract substrate coordinates of all the physical features defined in the gerber data. All the physical features defined in the gerber data become soldering target candidates, for which system coordinates will be derived.

(6) A slot extending in the y-axis direction for moving the two columns 122, 123 (FIG. 1) forward or rearward may be provided on the upper surface of the base 121 (FIG. 1). Then, under the control of the control section 170, the fourth motor 184 (FIG. 2) may be configured to move the two columns 122, 123 (FIG. 1) forward or rearward at the same time instead of being configured to move the installation base 125. Accordingly, the soldering iron 115 may actually be moved forward or rearward (in the y-axis direction).

(7) In the editing field A2 of the editing operation screen W1 (FIG. 3), in association with the system coordinate values of each soldering target, before and after soldering, an editing field (hereinafter referred to as an offset amount editing field) may be provided for the user to enter a distance in which the iron tip of the soldering iron 115 is retracted (hereinafter referred to as an offset amount) from the soldering target position. In accordance with this, the offset amount editing field may also be provided in the editing operation screen W2 (FIG. 6), and in step S16, the receiving part 171 may receive the offset amount edited in the editing field. Then, in step S19, the deriving part 172 may add the offset amounts received in step S16 to all the offset amount editing fields corresponding to all the position data editing field that are populated with derived system coordinates.

The above-described embodiment mainly includes a technique associated with the following non-limiting features.

A soldering apparatus according to one aspect of the above-described embodiment includes a motor and a computer. The motor is configure to move a soldering iron relative to a system origin point. The computer is configured to receive gerber data including definitions of a plurality of physical features of a substrate, the definitions including substrate coordinates for each of the physical features relative to a substrate origin point on the substrate, the substrate origin point being different from the system origin point. The computer is configured to receive, separately from the gerber data, system coordinates for the substrate origin point. The system coordinates for the substrate origin point are relative to the system origin point. The computer is configured to extract from the received gerber data, the substrate coordinates of at least one of the physical features. The computer is configured to use the extracted substrate coordinates to derive system coordinates for the at least one of the physical features of the substrate, the system coordinates for the at least one of the physical features being relative to the system origin point. The computer is configured to control the motor according to at least some of the derived system coordinates in order to perform a soldering process on the substrate.

A non-transitory computer-readable medium, according to one aspect of the above-described embodiment, stores instructions which, when executed by a computer of a soldering apparatus having a motor configured to move a soldering iron relative to a system origin point, cause the computer to perform a soldering method. The method comprises receiving gerber data including definitions of a plurality of physical features of a substrate, the definitions including substrate coordinates for each of the physical features relative to a substrate origin point on the substrate, the substrate origin point being different from the system origin point; receiving, separately from the gerber data, system coordinates for the substrate origin point, the system coordinates for the substrate origin point being relative to the system origin point; extracting from the received gerber data, the substrate coordinates of at least one of the physical features of the substrate; using the extracted substrate coordinates to derive system coordinates for the at least one of the physical features of the substrate, the system coordinates for the at least one of the physical features being relative to the system origin point; and controlling the motor according to at least some of the derived system coordinates in order to perform a soldering process on the substrate.

A soldering method, according to one aspect of the embodiment described above, is performed by a computer of a soldering apparatus having a motor configured to move a soldering iron relative to a system origin point. The method comprises receiving gerber data including definitions of a plurality of physical features of a substrate, the definitions including substrate coordinates for each of the physical features relative to a substrate origin point on the substrate, the substrate origin point being different from the system origin point; receiving, separately from the gerber data, system coordinates for the substrate origin point, the system coordinates for the substrate origin point being relative to the system origin point; extracting from the received gerber data, the substrate coordinates of at least one of the physical features of the substrate; and using the extracted substrate coordinates to derive system coordinates for the at least one of the physical features of the substrate, the system coordinates for the at least one of the physical features being relative to the system origin point; and controlling the motor according to at least some of the derived system coordinates in order to perform a soldering process on the substrate.

According to the above configuration, it is possible to effectively reduce labor of an operator who inputs soldering target positions. In other words, the operator may input the gerber data of the substrate and the system coordinates of the substrate origin point. As a result, the computer can extract, from the gerber data, the system coordinates of physical features that will be subjected to soldering. The system coordinates of physical features are relative (measured from) the system origin point. To derive the system coordinates of physical features, the computer uses the extracted substrate coordinates and the system coordinates of the substrate origin point.

As described above, according to the above configuration, the system coordinates can be derived without the operator inputting system coordinates one by one. Thereafter, the operator may select the some of the derived system coordinates (e.g., select a subset of the derived system coordinates from among all the derived system coordinates) for which soldering will be performed. Therefore, according to the above configuration, it is possible to effectively reduce the labor of the operator who inputs the coordinates of soldering targets.

With respect to the above configuration, the computer may receive a user selection input for selecting soldering targets. In this case, the computer may use the received user selection input to select, from among the derived system coordinates, a subset of the derived system coordinates. Thereafter, the computer controls the motor according to the selected subset of the derived system coordinates, instead of according to all the derived system coordinates, in order to perform the soldering process on the substrate.

According to this configuration, the operator can input information on a type of physical feature to be soldered. When such input is received by the computer, the computer extracts only the substrate coordinates of physical features that are of a type that corresponds to the received input. A potential effect is that the soldering target candidates are narrowed down. This allows the operator to input system coordinates of soldering targets more efficiently.

Regarding the above configuration, the inputted information on type of physical feature may indicate a shape of the physical feature. In such a case, the computer may specify soldering targets as the physical features of the indicated shape.

According to this configuration, the computer can extract, from the gerber data, the substrate coordinates of only the physical features of the indicated shape.

Regarding the above configuration, the system coordinates for the substrate origin point may be three-dimensional coordinates. For each position, the three-dimensional coordinates consist of three values that define the position in a three-dimensional space. Further, the substrate coordinates extracted from the gerber data may be two-dimensional coordinates. For each position, the two-dimensional coordinates consist of two values that define the position on a plane. In this case, the computer uses the extracted two-dimensional coordinates to derive three-dimension system coordinates of physical features that will be soldered.

In this configuration, the operator may input the gerber data of the substrate and the three-dimensional system coordinates of the substrate origin point. Thus, the computer can extract, from the gerber data of the substrate, the two-dimensional coordinates of physical features that will be soldered, the two-dimensional coordinates being relative to the substrate origin point. Further, the computer can derive three-dimensional coordinates of physical features that will be soldered, by using the extracted two-dimensional coordinate values and the three-dimensional system coordinates of the substrate origin point input by the operator.

The computer may receive a user selection input for selecting soldering targets. The user selection input is used to select, from among the derived system coordinates, a subset of the derived system coordinates. The subset of the derived system coordinates are used to control the motor in order to perform a soldering process.

According to the present configuration, even if the operator does not individually input system coordinates for soldering targets, the operator can select, from among system coordinates that were derived from gerber data, a subset of the derived system coordinates. Thus, it is possible to efficiently select system coordinates of soldering targets.

The computer may further receive user editing input for editing coordinates. The received user editing input is used to generate changed system coordinates from the derived system coordinates.

In this configuration, the changed system coordinates are used by the computer to control the motor in order to perform a soldering process. It will be appreciated that the operator can appropriately edit the derived system coordinates to what the operator deems to be appropriate.

The soldering apparatus may further include an installation base for installing the substrate. In this case, the computer may receive input of inversion information representing an orientation of the substrate on the installation base, the orientation being that of the substrate having been turned over about a first axis parallel to a side edge of the substrate. The computer uses the extracted substrate coordinates and the inversion information to derive the system coordinates for the at least one of the physical features of the substrate. According to the received inversion information, the computer inverts a positive/negative sign of a value in the extracted substrate coordinates in order to derive the system coordinates for the at least one of the physical features of the substrate. The value is along a second axis orthogonal to the first axis.

In this configuration, the operator inputs the inversion information in situations when the substrate is turned over around the axis parallel to the one side of the substrate and installed on the installation base. This allows the user to specify soldering targets on the underside (back side) of the substrate, and allows the computer to derive system coordinates for those soldering targets.

While several particular forms of the invention have been illustrated and described, it will also be apparent that various modifications may be made without departing from the scope of the invention. It is also contemplated that various combinations or subcombinations of the specific features and aspects of the disclosed embodiments may be combined with or substituted for one another in order to form varying modes of the invention. Accordingly, it is not intended that the invention be limited, except as by the appended claims.

What is claimed is:

1. A soldering apparatus comprising:
a motor configured to move a soldering iron relative to a system origin point; and
a computer configured to
receive gerber data including definitions of a plurality of physical features of a substrate, the definitions including substrate coordinates for each of the physical features relative to a substrate origin point on the substrate, the substrate origin point being different from the system origin point, the definitions further including identifiers for physical feature type, receive, separately from the gerber data, system coordinates for the substrate origin point, the system coordinates for the substrate origin point being relative to the system origin point, extract from the received gerber data, the substrate coordinates of at least one of the physical features, receive, separately from the gerber data, information on a type of physical feature to be soldered, compare the received information to the identifiers for physical feature type during the extracting of the substrate coordinates from the received gerber data, such that the extracted substrate coordinates are for physical features that are of a type that corresponds to the received information, use the extracted substrate coordinates to derive system coordinates for the at least one of the physical features of the substrate, the system coordinates for the at least one of the physical features being relative to the system origin point, and control the motor according to at least some of the derived system coordinates in order to perform a soldering process on the substrate.

2. The soldering apparatus of claim 1, wherein the received information on a type of physical feature indicates a shape of the physical feature.

3. The soldering apparatus of claim 2, wherein
the system coordinates for the substrate origin point are three-dimensional coordinates,
the extracted substrate coordinates, of the at least one of the physical features, are two-dimensional coordinates,
the computer is configured to use the two-dimensional coordinates to derive the system coordinates for the at least one of the physical features, the derived system coordinates being three-dimensional coordinates, and
the controlling of the motor by the computer is performed according to the derived three-dimensional coordinates in order to perform the soldering process on the substrate.

4. The soldering apparatus of claim 1, wherein
the system coordinates for the substrate origin point are three-dimensional coordinates,
the extracted substrate coordinates, of the at least one of the physical features, are two-dimensional coordinates,
the computer is configured to use the two-dimensional coordinates to derive the system coordinates for the at least one of the physical features, the derived system coordinates being three-dimensional coordinates, and
the controlling of the motor by the computer is performed according to the derived three-dimensional coordinates in order to perform the soldering process on the substrate.

5. The soldering apparatus of claim 1, wherein the computer is configured to
receive user selection input for selecting soldering targets, and
use the received user selection input to select, from among the derived system coordinates, a subset of the derived system coordinates,
wherein the controlling of the motor by the computer is performed according to the selected subset of the derived system coordinates, instead of according to all the derived system coordinates, in order to perform the soldering process on the substrate.

6. The soldering apparatus of claim 5, wherein the computer is configured to receive user editing input for editing coordinates, and
use the received user editing input to generate changed system coordinates from the derived system coordinates,
wherein the controlling of the motor by the computer is performed at least according to the changed system coordinates in order to perform the soldering process on the substrate.

7. The soldering apparatus of claim 5, wherein the computer is configured to receive inversion information representing an orientation of the substrate relative to the soldering apparatus, the orientation being that of the substrate having been turned over about a first axis of the soldering apparatus,
the computer uses the extracted substrate coordinates and the inversion information to derive the system coordinates for the at least one of the physical features of the substrate, and
according to the inversion information, the computer inverts a positive/negative sign of a value in the extracted substrate coordinates in order to derive the system coordinates for the at least one of the physical features of the substrate, and the value is along a second axis orthogonal to the first axis.

8. The soldering apparatus of claim 7, wherein the computer is configured to receive user editing input for editing coordinates, and
use the received user editing input to generate changed system coordinates from the derived system coordinates,
wherein the controlling of the motor by the computer is performed at least according to the changed system coordinates in order to perform the soldering process on the substrate.

9. The soldering apparatus of claim 1, wherein the computer is configured to receive inversion information representing an orientation of the substrate relative to the soldering apparatus, the orientation being that of the substrate having been turned over about a first axis of the soldering apparatus,
the computer uses the extracted substrate coordinates and the inversion information to derive the system coordinates for the at least one of the physical features of the substrate, and
according to the inversion information, the computer inverts a positive/negative sign of a value in the extracted substrate coordinates in order to derive the system coordinates for the at least one of the physical features of the substrate, and the value is along a second axis orthogonal to the first axis.

10. The soldering apparatus of claim 1, wherein the system coordinates for the substrate origin point are three-dimensional coordinates,
the extracted substrate coordinates, of the at least one of the physical features, are two-dimensional coordinates,
the computer is configured to use the two-dimensional coordinates to derive the system coordinates for the at least one of the physical features, the derived system coordinates being three-dimensional coordinates, and
the controlling of the motor by the computer is performed according to the derived three-dimensional coordinates in order to perform the soldering process on the substrate.

11. A non-transitory computer-readable medium storing instructions which, when executed by a computer of a soldering apparatus having a motor configured to move a soldering iron relative to a system origin point, cause the computer to perform a soldering method comprising:

receiving gerber data including definitions of a plurality of physical features of a substrate, the definitions including substrate coordinates for each of the physical features relative to a substrate origin point on the substrate, the substrate origin point being different from the system origin point, the definitions further including identifiers for physical feature type;
receiving, separately from the gerber data, system coordinates for the substrate origin point, the system coordinates for the substrate origin point being relative to the system origin point;
extracting from the received gerber data, the substrate coordinates of at least one of the physical features of the substrate;
receiving, separately from the gerber data, information on a type of physical feature to be soldered,
comparing the received information to the identifiers for physical feature type during the extracting of the substrate coordinates from the received gerber data, such that the extracted substrate coordinates are for physical features that are of a type that corresponds to the received information,
using the extracted substrate coordinates to derive system coordinates for the at least one of the physical features of the substrate, the system coordinates for the at least one of the physical features being relative to the system origin point; and
controlling the motor according to at least some of the derived system coordinates in order to perform a soldering process on the substrate.

12. The non-transitory computer-readable medium of claim 11, wherein the received information on a type of physical feature indicates a shape of the physical feature.

13. The non-transitory computer-readable medium of claim 11, wherein the system coordinates for the substrate origin point are three-dimensional coordinates,
the extracted substrate coordinates, of the at least one of the physical features, are two-dimensional coordinates,
the computer uses the two-dimensional coordinates to derive the system coordinates for the at least one of the physical features, the derived system coordinates being three-dimensional coordinates, and
the controlling of the motor is performed according to the derived three-dimensional coordinates in order to perform the soldering process on the substrate.

14. A soldering method performed by a computer of a soldering apparatus having a motor configured to move a soldering iron relative to a system origin point, the method comprising:

receiving gerber data including definitions of a plurality of physical features of a substrate, the definitions including substrate coordinates for each of the physical features relative to a substrate origin point on the substrate, the substrate origin point being different from the system origin point, the definitions further including identifiers for physical feature type;
receiving, separately from the gerber data, system coordinates for the substrate origin point, the system coordinates for the substrate origin point being relative to the system origin point;

extracting from the received gerber data, the substrate coordinates of at least one of the physical features of the substrate; and receiving, separately from the gerber data, information on a type of physical feature to be soldered, comparing the received information to the identifiers for physical feature type during the extracting of the substrate coordinates from the received gerber data, such that the extracted substrate coordinates are for physical features that are of a type that corresponds to the received information, using the extracted substrate coordinates to derive system coordinates for the at least one of the physical features of the substrate, the system coordinates for the at least one of the physical features being relative to the system origin point; and controlling the motor according to at least some of the derived system coordinates in order to perform a soldering process on the substrate.

15. The method of claim 14, wherein the received information on a type of physical feature indicates a shape of the physical feature.

16. The method of claim 14, wherein the system coordinates for the substrate origin point are three-dimensional coordinates, the extracted substrate coordinates, of the at least one of the physical features, are two-dimensional coordinates, the computer uses the two-dimensional coordinates to derive the system coordinates for the at least one of the physical features, the derived system coordinates being three-dimensional coordinates, and the controlling of the motor is performed according to the derived three-dimensional coordinates in order to perform the soldering process on the substrate.

\* \* \* \* \*